(12) United States Patent
Wang et al.

(10) Patent No.: US 11,159,894 B2
(45) Date of Patent: Oct. 26, 2021

(54) MEMS MICROPHONE

(71) Applicant: AAC Acoustic Technologies (Shenzhen) Co., Ltd., Shenzhen (CN)

(72) Inventors: Linlin Wang, Shenzhen (CN); Xiaohui Zhong, Shenzhen (CN); Rui Zhang, Shenzhen (CN); Zhenkui Meng, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/827,673

(22) Filed: Mar. 23, 2020

(65) Prior Publication Data
US 2021/0204069 A1 Jul. 1, 2021

(30) Foreign Application Priority Data
Dec. 30, 2019 (CN) .......................... 201922455769.3

(51) Int. Cl.
| H04R 19/00 | (2006.01) |
| H04R 19/04 | (2006.01) |
| H04R 1/04 | (2006.01) |
| H04R 7/04 | (2006.01) |
| B81B 3/00 | (2006.01) |
| B81C 1/00 | (2006.01) |

(52) U.S. Cl.
CPC .......... *H04R 19/04* (2013.01); *B81B 3/0078* (2013.01); *H04R 1/04* (2013.01); *H04R 7/04* (2013.01); *B81B 2201/0257* (2013.01); *B81B 2203/0127* (2013.01); *B81B 2203/0315* (2013.01); *B81B 2203/0361* (2013.01); *B81C 1/00849* (2013.01); *H04R 2201/003* (2013.01)

(58) Field of Classification Search
CPC . H04R 19/04; H04R 7/04; H04R 1/04; H04R 2201/003; B81B 3/0078; B81B 2201/0257; B81B 2203/0361; B81B 2203/0127; B81B 2203/0315; B81C 1/00849

See application file for complete search history.

(56) References Cited

U.S. PATENT DOCUMENTS

2015/0109889 A1* 4/2015 Chen .................... H04R 19/005
367/189
2018/0077499 A1* 3/2018 Yoo ..................... H01L 51/0048

* cited by examiner

*Primary Examiner* — Matthew A Eason
(74) *Attorney, Agent, or Firm* — W&G Law Group

(57) ABSTRACT

The present invention provides a MEMS microphone, having a base and a capacitive system provided on the base. The capacitive system includes a diaphragm and a back plate. The MEMS microphone is further provided with a supporting frame located between the back plate and the diaphragm. One end of the supporting frame is connected with the back plate, and the other end is connected with the diaphragm. The supporting frame divides the cavity into a first cavity body and a second cavity body. The supporting frame is provided with a connection channel. During the production process of the MEMS microphone, the etchant enters the first cavity body, and then enters the second cavity body, which prevents oxides from remaining in the microphone product and affecting the use of MEMS microphone.

5 Claims, 2 Drawing Sheets

MEMS MICROPHONE

FIELD OF THE PRESENT DISCLOSURE

The present invention relates to a microphone in particular to a MEMS microphone.

DESCRIPTION OF RELATED ART

The MEMS microphone generally comprises a base and a capacitive system provided on the base. The capacitive system comprises a diaphragm and a back plate that is disposed at a distance from the diaphragm and forms a cavity with the diaphragm. When the MEMS microphone is powered and working, the diaphragm and the back plate respectively carry charges of opposite polarity. At the same time, a supporting frame is provided between the back plate and the diaphragm to support the back plate. Due to the existence of the supporting frame, the supporting frame divides the cavity formed between the back plate and the diaphragm into a second cavity body located on the edge and a first cavity body located in the middle. During the production process of MEMS microphones, first, the oxide material is injected into the cavity formed between the back plate and the diaphragm, and then an etchant is injected through the amplification hole on the back plate into the cavity so that the oxide in the cavity is corroded. But due to the existence of the supporting frame, the etchant can only erode the oxide material in the first cavity body in the middle, but cannot erode the oxide in the second cavity body on the edge so the oxide remains in the microphone product and affects the use of MEMS microphone.

SUMMARY OF THE PRESENT INVENTION

One of the objects of the present invention is to provide a MEMS microphone which is enable to prevent oxides from remaining in the microphone.

For achieving the object, the present invention provides a MEMS microphone including a base comprising a back cavity;

a capacitive system provided on the base, the capacitive system including a diaphragm and a back plate arranged spaced from the diaphragm and forming a cavity with the diaphragm;

a supporting frame located between the back plate and the diaphragm, one end of the supporting frame being connected with the back plate, and the other end being connected with the diaphragm; wherein the supporting frame divides the cavity into a first cavity body located in a middle thereof and a second cavity body surrounding the first cavity body; the supporting frame is provided with a connection channel connecting the first cavity body and the second cavity body.

Further, the supporting frame is a hollow circular structure.

Further, the supporting frame is provided with through holes, and the through hole connects the first cavity body with the second cavity body.

Further, the supporting frame comprises a plurality of supporting cylinders, a gap is formed between adjacent supporting cylinders, for connecting the first cavity body and the second cavity body.

Further, a cross section of the supporting cylinder is a square, a circle, a triangle, or a hexagon.

Further, the supporting frame comprises a supporting cylinder array arranged on edge of a circle, the supporting cylinder array comprises a plurality of supporting cylinders, and in the supporting cylinder array, the gap is formed between adjacent supporting cylinders.

Further, the supporting frame comprises n+1 supporting cylinder arrays arranged on edge of a circle with interval, the i+1th supporting cylinder array is arranged around the ith supporting cylinder; wherein n is a natural number greater than or equal to 1, and the range of i is [1, n].

Further, the supporting frame is made of conductive material.

Further, the supporting frame is made of insulating material.

Further, the diaphragm is arranged above the base and spaced from the base, and the back plate is arranged above the diaphragm.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
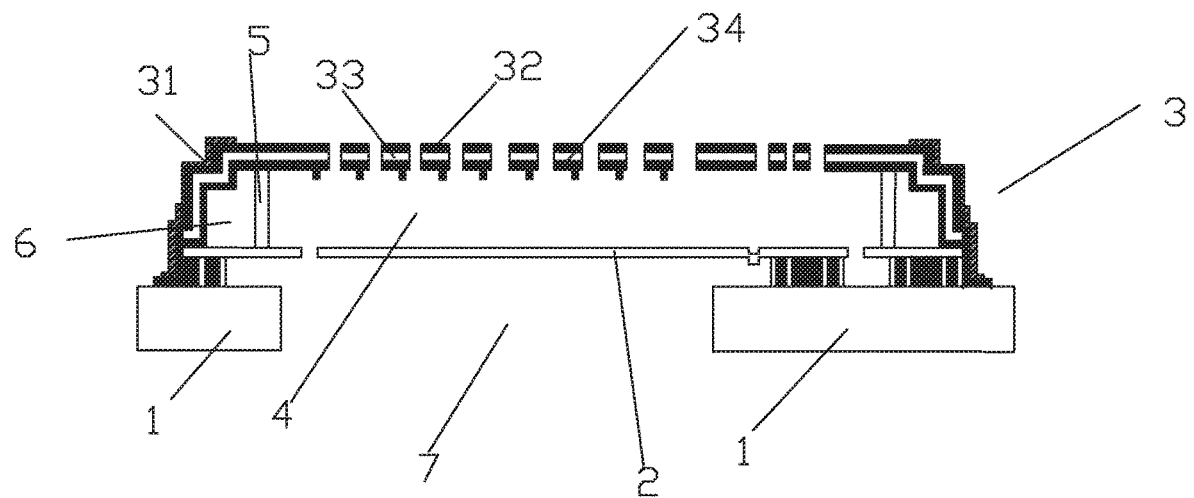
FIG. 1 is a vertical cross-sectional sectional view of a MEMS microphone provided by an exemplary embodiment of the present invention.
Figure 2:
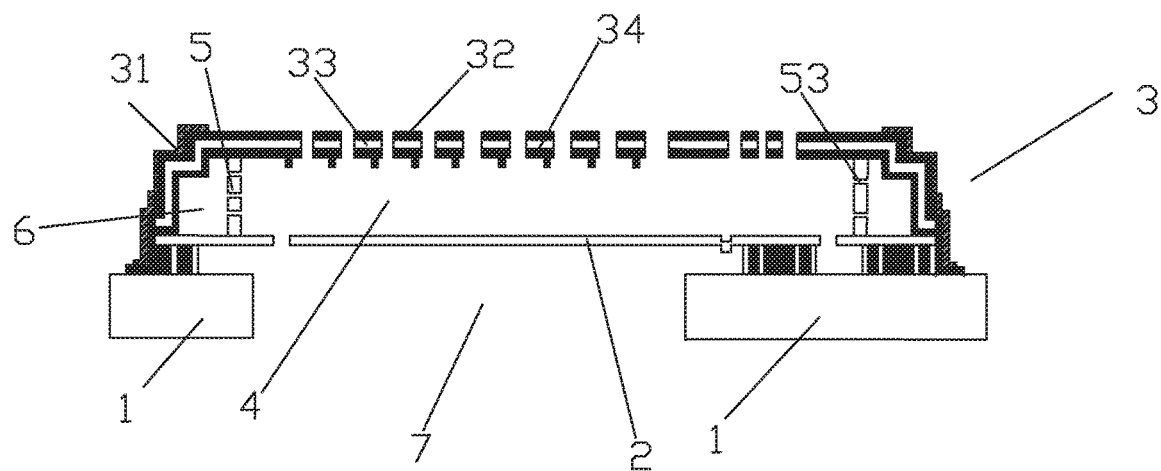
FIG. 2 is similar to FIG. 1 but through-holes are formed in a supporting frame of the MEMS microphone.
Figure 3:
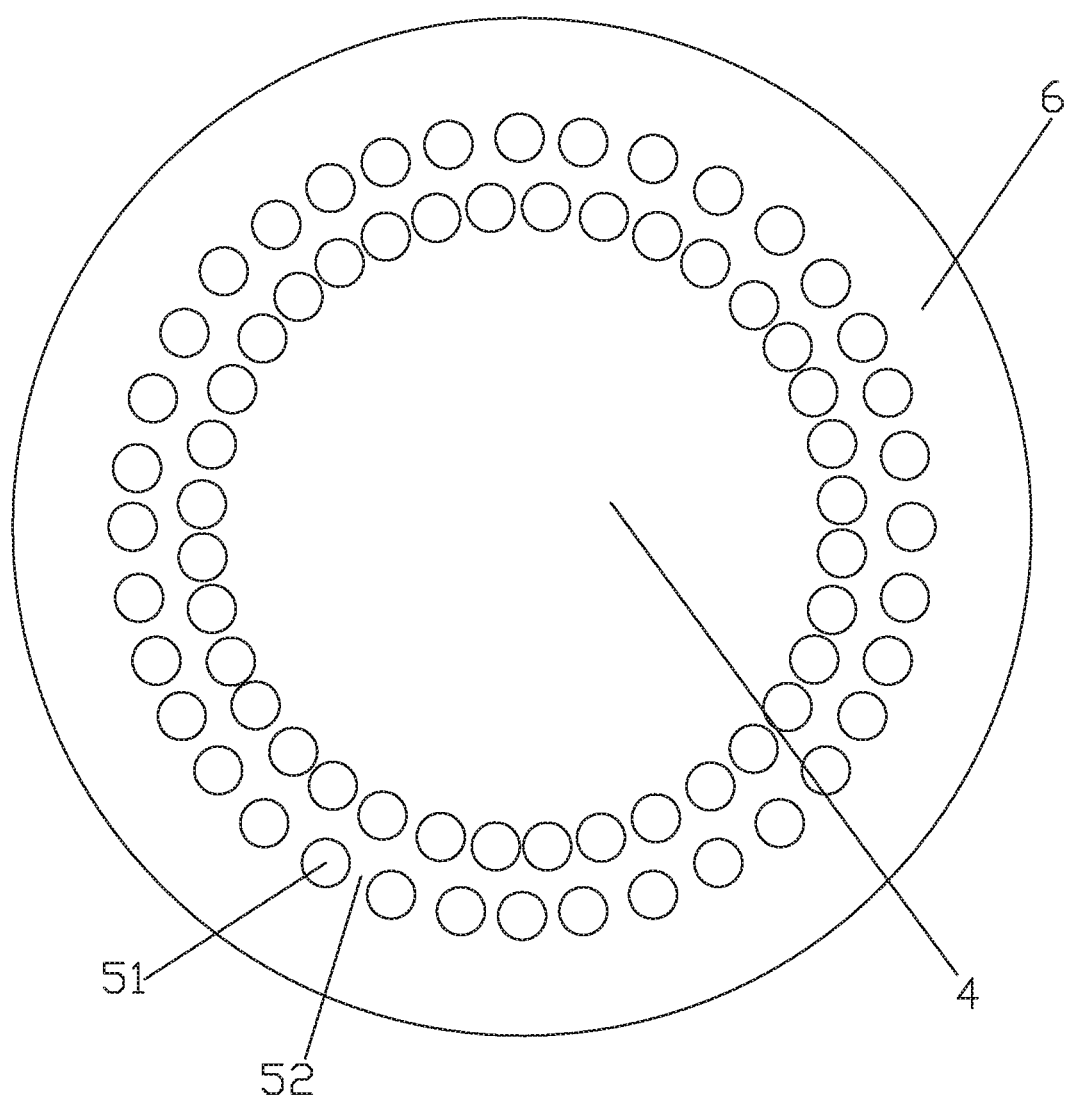
FIG. 3 is a cross-sectional view of the supporting frame in FIG. 1.

As shown in FIGS. 1-3, the present invention provides a MEMS microphone which comprises a base 1 having a back cavity 7 and a capacitive system disposed on the base 1.

The capacitive system comprises a diaphragm 2 and a back plate 3 which is spaced from the diaphragm 2 and forms a cavity with the diaphragm 2. When the MEMS microphone is powered and working, the diaphragm 2 and back plate 3 respectively have charges of opposite polarity and form a capacitive system. At this time, when the sound wave reaches diaphragm 2 from back cavity 7, the diaphragm 2 vibrates under the influence of sound wave which causes the spacing distance between diaphragm 2 and back plate 3 change and further causes the capacitance in the capacitive system change so as to achieve the conversion from acoustic wave into electrical signal and realize the corresponding functions of the MEMS microphone.

Further, a supporting frame 5 is provided between the diaphragm 2 and the back plate 3. One end of the supporting frame 5 is connected with the back plate 3 and the other end is connected with the diaphragm 2. The supporting frame 5 divides the cavity formed between the back plate 3 and the diaphragm 2 into a first cavity body 4 in the middle and a second cavity body 6 in the periphery.

In order to ensure that during the production of MEMS microphone, the oxide in the second cavity body 6 located in the periphery is removed to avoid remaining in the MEMS microphone products, in the present invention, a connection channel is set in the supporting frame 5, the connection channel can connect the first cavity body 4 with the second cavity body 6.

Preferably, the supporting frame 5 is a hollow circular structure.

As shown in FIG. 2, through holes 53 are provided on the supporting frame 5, and the through hole 53 connect the first cavity body 4 with the second cavity body 6.

Further, the supporting frame 5 comprises multiple supporting cylinders 51, a gap 52 is formed between the adjacent supporting cylinders 51, the gap 52 is a connection channel connecting the first cavity body 4 with the second cavity body 6.

Further, the cross section of the supporting cylinder 51 is other shapes such as a square, a circle, a triangle, or a hexagon.

Further, according to different arrangements of multiple supporting cylinders 51, the supporting frame 5 further comprises one or multiple supporting cylinder arrays arranged on edge of a circle.

Wherein, each supporting cylinder array comprises multiple supporting cylinders 51, a gap 52 is formed between the adjacent supporting cylinders 51 in each supporting cylinder array.

Preferably, when the supporting frame 5 comprises multiple supporting cylinder arrays, multiple supporting cylinder arrays are arranged with interval on edge of a circle. The supporting cylinder array of adjacent circles is arranged on edge of a circle.

That is, when the supporting frame 5 comprises n+1 supporting cylinder arrays arranged with interval on edge of a circle, the i+1th supporting cylinder array is arranged around the ith supporting cylinder array, where n is a natural number greater than or equal to 1, and the range of i is [1, n].

For example, as shown in FIG. 3 the supporting frame 5 comprises two supporting cylinder arrays, which are respectively recorded as a first supporting cylinder array and a second supporting cylinder array. The first supporting cylinder array surrounds the second supporting cylinder array.

Further, the supporting cylinder 51 is made of conductive material or insulating material.

Preferably, as shown in FIGS. 1 and 2, the back plate 3 of the MEMS microphone in this embodiment further comprises a first insulation layer 32, an electrode layer 33, and a second insulation layer 34 which are sequentially stacked. The second insulation layer 34 is arranged opposite to the diaphragm.

Wherein, the electrode layer 33 is arranged between the first insulation layer 32 and the second insulation layer 34 to avoid a situation where a short-circuit occurs due to the contact between the diaphragm 2 and the electrode layer 33 of the back plate 3 during the diaphragm vibration of diaphragm 2.

Preferably, the periphery of the first insulation layer 32 is in a stair shape and is connected with the base 1.

Preferably, the back plate 3 is further provided with a metal layer 31 covering the periphery of the first insulation layer 32

In the MEMS microphone in this embodiment, diaphragm 2 is arranged between the back plate 3 and the base 1, and a cavity is formed between the diaphragm 2 and the back plate 3. The diaphragm 2 is arranged above the base 1 and is spaced from the base 1. In general, the base 1 of the MEMS microphone is a circular structure, and the corresponding diaphragm 2 is also a circular structure. FIG. 1 or FIG. 2 in this embodiment only shows a vertical cross sectional structure view of vertical view of the MEMS microphone.

The present invention is improved by the supporting frame 5 provided between diaphragm 2 and back plate 3, and a connection channel connecting the first cavity body 4 and the second cavity body 6 is arranged on the supporting frame 5 so that during the production process of the product, the etchant etc. can enter the second cavity body 6 from the first cavity body 4 to corrode the oxide in the second cavity body 6 and completely remove the oxide in the second cavity body 6, which prevent oxides from remaining in MEMS microphone products and affecting the use of microphones.

Besides, the present invention only improves the supporting frame 5 and does not remove the supporting frame 5 and also guarantees the intensity of the back plate 3.

In addition, the improvement of the supporting frame 5 in the present invention does not change due to position change of the diaphragm 2 and the back plate 3. The back plate 3 shown in FIG. 1 in the present embodiment is arranged above the diaphragm 2. And when the back plate 3 is under the diaphragm 2, the structure of the supporting frame 5 is also applicable.

What have been described above are only the embodiments of the present invention. It should be pointed out that for those skilled in the art, improvements can be made without departing from the inventive concept of the present invention which is also in protection scope of the present invention.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:
1. A MEMS microphone, comprising:
a base comprising a back cavity;
a capacitive system provided on the base, the capacitive system including a diaphragm and a back plate arranged spaced from the diaphragm and forming a cavity with the diaphragm;
a supporting frame located between the back plate and the diaphragm, one end of the supporting frame being connected with the back plate, and the other end being connected with the diaphragm; wherein
the supporting frame divides the cavity into a first cavity body located in a middle thereof and a second cavity body surrounding the first cavity body; the supporting frame is provided with a connection channel connecting the first cavity body and the second cavity body;
the supporting frame comprises a supporting cylinder array arranged on edge of a circle, the supporting cylinder array comprises a plurality of supporting cylinders, and in the supporting cylinder array, a gap is formed between adjacent supporting cylinders for connecting the first cavity body and the second cavity body;
the supporting frame comprises n+1 supporting cylinder arrays arranged on edge of a circle with interval, the i+1th supporting cylinder array is arranged around the ith supporting cylinder; wherein n is a natural number greater than or equal to 1, and the range of i is [1, n].

2. The MEMS microphone as described in claim 1, wherein a cross section of the supporting cylinder is a square, a circle, a triangle, or a hexagon.

3. The MEMS microphone as described in claim 1, wherein the supporting frame is made of conductive material.

4. The MEMS microphone as described in claim 1, wherein the supporting frame is made of insulating material.

5. The MEMS microphone as described in claim 1, wherein the diaphragm is arranged above the base and spaced from the base, and the back plate is arranged above the diaphragm.

* * * * *